(12) United States Patent
McMillian et al.

(10) Patent No.: US 6,175,508 B1
(45) Date of Patent: Jan. 16, 2001

(54) FORM FACTOR-CONFIGURED CHANNEL BANK CARD CONTAINING FORM FACTOR NON-CONFORMAL PRINTED CIRCUIT BOARD

(75) Inventors: Lonnie S. McMillian, Madison; Wade S. Schofield; Barry S. Smith, both of Huntsville, all of AL (US)

(73) Assignee: Adtran Corporation, Hunststville, AL (US)

( * ) Notice: Under 35 U.S.C. 154(b), the term of this patent shall be extended for 0 days.

(21) Appl. No.: 09/362,016

(22) Filed: Jul. 27, 1999

Related U.S. Application Data

(63) Continuation of application No. 08/753,106, filed on Nov. 20, 1996, now Pat. No. 5,959,847.

(51) Int. Cl.[7] .................................................. H05K 7/14
(52) U.S. Cl. ......................... 361/796; 361/752; 361/803; 439/928.1
(58) Field of Search ..................................... 361/728, 736, 361/752, 759, 796, 798, 801, 802, 808, 825; 439/76.1, 74, 377, 928.1; 206/706; 211/41.17

(56) References Cited

U.S. PATENT DOCUMENTS

| 4,893,301 | * | 1/1990 | Andrews et al. | 370/364 |
| 4,894,753 | * | 1/1990 | Wedell et al. | 361/818 |
| 4,986,778 | * | 1/1991 | Liken et al. | 439/74 |
| 5,853,297 | * | 12/1998 | Moulton et al. | 439/327 |

* cited by examiner

Primary Examiner—Jayprakash N. Gandhi
(74) Attorney, Agent, or Firm—Allen, Dyer, Doppelt & Milbrath & Gilchrist, P.A.

(57) ABSTRACT

A composite circuit card architecture conforms with a prescribed form factor for installation in a card slot and connection to a backplane of a multiple circuit card-supporting housing. Only a portion of the card is comprised of printed wiring board material, while the remainder, where no printed circuit components are installed, is a support substrate formed of a material other than that of said printed wiring board. Also, a front panel portion is formed of the material other than that of the printed wiring board, such as plastic integrally molded with the support substrate, thereby significantly reducing the cost associated with the conventional approach of making the entire card from printed circuit board material. At one communication link, such as a ribbon cable, may be coupled between the printed wiring board and at least one input/output port at the front panel.

15 Claims, 3 Drawing Sheets

FORM FACTOR-CONFIGURED CHANNEL BANK CARD CONTAINING FORM FACTOR NON-CONFORMAL PRINTED CIRCUIT BOARD

This is a continuation of application Ser. No. 08/753,106, filed Nov. 20, 1996, now U.S. Pat. No. 5,959,847, issued Sep. 28, 1999.

FIELD OF THE INVENTION

The present invention relates in general to hardware configurations for electronic circuits, such as those used in telecommunication equipment, and is particularly directed to a new and improved circuit card architecture, that is installable in a respective card slot of a cabinet or rack for electrical and physical engagement with a backplane connector, and which includes a face plate that forms part of the front panel of the cabinet in which the card is installed.

BACKGROUND OF THE INVENTION

For space efficiency and ease of access to circuit components, housing configurations for electronic circuits, such as those employed in channel banks of telecommunication equipment, such as a D4 channel bank customarily contain a plurality of parallel circuit card slots having parallel card guide and support tracks, that are sized to receive respective electronic circuit cards which plug into electrical backplane connectors at a rear portion of a cabinet or rack.

FIGS. 1–3 diagrammatically illustrate a typical example of standard printed wiring board or card 10 that is configured to engage a backplane connector. For purposes of providing a non-limiting example, FIGS. 1–3 show the backplane connector configured as a card edge connector which receives and engages a plurality of lead conductor traces 12 that extend to a first or rear end of the card 10. The card 10 itself has a prescribed industry standard size and shape ('form factor'), and is typically made of a generally longitudinal rectangularly shaped sheet of fiberglass.

The lead connector traces 12 are connected to circuit components 13 mounted on the board proper by way of patterned conductive material 14 that has been selectively etched onto the fiberglass sheet of which the printed wiring board 10 is made. The lead connector traces 12 are sized and arranged to engage associated conductors along the interior sides of a backplane connector 15, when the rear end of the card 10 is physically inserted into and is captured by the connector, thereby providing backplane connections to the circuit components of the card. The backplane connector further serves to physically capture and thereby stabilize the card in its card slot.

A second (front) end 16 of the card 10 is affixed to a (metallic) face plate or front panel 17, that is sized to fit within and thereby close a portion of a card slot opening 18 at the front of the equipment rack. Upper and lower card slot guide tracks 19 and 20 are sized to receive upper and lower edges 21 and 22, respectively, of the card 10, so that, as the printed circuit card 10 is inserted into the cabinet through the card slot opening 18, it slides within the guide tracks 19 and 20 until the rear end 11 of the card containing the conductive traces 12 is physically plugged into and captured by the backplane connector 15. Once installed in its card slot, the card's form factor will place the face plate coincident with the front panel of the rack, thereby closing the card insertion opening.

Now although continuing improvements in the semiconductor industry have enhanced the microminiaturization of electronic circuit components, and thereby reduced the size of the components themselves and the printed circuit board real estate required to implement such circuits, such as the telecommunication circuits of channel bank installations, telecommunication service providers are not readily desirous of replacing an existing piece of equipment simply because it can be made somewhat smaller or housed in a more compact configuration. Indeed, the axiom "if it ain't broke, don't fix it," can be considered to apply to telecommunication equipment configurations that have been and can be expected to continue to provide satisfactory service to telco customers.

This is especially true in the case of relatively low end, standardized circuit cards, whose principal driving force is cost, where the cheaper the card can be produced, the better. Since such cards have a relatively fixed, universal form factor, and employ circuit components whose integration densities have essentially stabilized, namely, reached a point that no longer provides a substantial reduction in the cost of the circuit, per se, the circuits themselves are now essentially fixed cost items to the circuit card supplier.

SUMMARY OF THE INVENTION

In accordance with the present invention, the desire to further reduce the cost of printed wiring board-implemented circuits, such as, but not limited to, those employed in telecommunication channel bank equipment, (such as a D4 channel bank) referenced above, where the circuits per se are essentially standardized, fixed cost items, is readily accomplished by a new and improved 'composite' circuit card architecture, which configures only a necessary portion of the composite circuit card of printed wiring board material, rather than the entire card, as in conventional configurations. As pointed out above, the ability to employ a reduced size printed wiring board results from the improvements in integration density to circuit sizes that are now considerably smaller than or only a fraction of the available mounting area of the standard card form factor. The remainder of the card architecture, including the front panel, where no printed circuit components are installed, is formed of a material, such as molded plastic, which is less costly than that of the printed wiring board, thereby significantly reducing the cost associated with the conventional approach of making the entire card from printed circuit board material.

Namely, the 'composite' circuit card architecture of the present invention is essentially comprised of two principal components—a form factor conformal or compatible 'pseudo' circuit card, which is preferably made of an injection molded plastic material, that is considerably less expensive than standard printed circuit card material (a printed circuit-patterned fiberglass sheet), and—a reduced size or non form factor-conformal printed circuit board. The pseudo circuit card includes a generally rectangular card-shaped support substrate as a supporting motherboard and a front panel integrally molded therewith. By form factor conformal or compatible is meant that the support substrate is dimensioned to generally correspond to the size and shape of an industry standard printed circuit card, described above.

As will be more fully appreciated from the detailed description to follow, by making as much of the inventive circuit card as possible out of a relatively inexpensive material (here, the entire pseudo card, including all of the support substrate and the front panel, as well), for example, using an injected molded plastic process through which plastic multiple cards (which may contain varying irregularities) are easily reproduced, not only is the cost of the actual materials within the finished card substantially reduced, but the cost of material that would otherwise be wasted, but still used in the manufacturing process, is minimized.

As a simple comparison, in a conventional form factor compatible card, the front panel is made of formed metal (such as, but not limited to brushed, extruded or cast aluminum), while the entirety of the card material, to which the metallic front panel is attached, and which fits into the card slot and engages the backplane connector, is cut out from a sheet of standard fiberglass printed wiring board. Any trimming of such wiring board material into the final shape of the card will necessarily leave scrap printed circuit fiberglass as unusable and costly waste. In contrast, the circuit card architecture of the present invention uses only that amount of printed fiberglass wiring board that is necessary to implement the functionality of the signal processing circuit of interest. Any remaining material required for physical support and for realizing an overall form factor-compatible card configuration is made of a less costly, but mechanically equivalent, material, such as injection molded plastic. Because this remaining material is preformed (as by injection molding), the amount of waste that results from cutting a considerably smaller sized section of fiberglass wiring board (for the printed circuit) is minimized.

The support substrate motherboard has a height that corresponds to the spacing between upper and lower guide tracks of a standard card slot, so that it is readily slidable therein, when inserted through the front of an equipment rack, thereby bringing the front panel to a position that is coincident with the front panel of the rack, closing its card slot portion of the card insertion opening. The length of the support substrate is dimensioned slightly less than that of a standard card, so that when the card is inserted into a card slot, a rear edge portion of the support substrate will not reach the backplane connector.

However, lead connector traces along a rear edge portion of a printed wiring daughterboard, which is considerably smaller than and is affixed to the support substrate by way of a carrier frame, extend beyond the rear edge portion of the support substrate and engage the backplane connector. These lead connector traces are connected to the interconnect traces of the patterned conductive material that has been selectively etched onto the printed wiring board.

The carrier frame of the molded plastic support substrate is configured to support the printed wiring board in a position such that, when the support substrate is inserted into a card slot, the rear edge region of the printed wiring board will be aligned with and insertible into a respective card slot's backplane connector, so that backplane connections to the circuit components of the circuit installed on the printed wiring board may be effected. For this purpose, generally rectangular card-configured support substrate has a first, generally planar-shaped support substrate portion. This first support substrate portion has top and bottom edges which are alignable with and insertible into the upper and lower guide tracks of a respective card slot. The first substrate portion is integrally joined with and terminates at the front panel.

The support substrate also includes a second, generally flat support substrate portion that is slightly recessed relative to the first substrate portion. The second substrate portion has upper and lower edges that are spaced from the top and bottom edges, so as to provide sufficient clearance for the support substrate to be slidably insertible into guide tracks of a respective card slot, while still accommodating upper and lower printed wiring board engagement rails of the carrier frame.

Each of the upper and lower engagement rails of the carrier frame has a set of generally bar-configured stops having a width corresponding to the depth of the second, generally flat substrate portion relative to the first substrate portion. This width of the stops is such that placement of the printed wiring board against these stops will locate the printed wiring board in the plane of the first substrate portion, thereby aligning the rear edge of the printed wiring board with the top and bottom edges of the support substrate and thereby with a backplane connector adjacent to the interior terminal ends of the upper and lower guide tracks of a respective card slot.

Disposed along the outer edge of each engagement rail are wedge-shaped tab elements having interior edges spaced apart from the stops so as to form a channel therebetween. The width of the channel corresponds generally to the thickness of the printed wiring board. As a result, when upper and lower edges of the printed wiring board are inserted into the channels of the engagement rails of the carrier frame, the card is captured on the support substrate. When the printed wiring daughterboard is thus mounted to the support substrate, its rear edge, which contains the backplane connector engaging traces, is aligned with the top and bottom edges of the support substrate, and thereby with a backplane connector adjacent to the interior terminal ends of the upper and lower guide tracks of a respective card slot.

The composite card architecture of the invention may further include at least one input/output port that is accessible at the integrally molded front panel, and at least one associated communication link coupled between the reduced size printed circuit board, and the at least one input/output port at the front end of the of the pseudo circuit card adjacent to the card's front panel. For this purpose, the front panel may have a plurality of circular apertures that are sized to receive ends of a set of communication links, such as light pipes, which are optically coupled to a set of electro-optic transducers (such as light emitting diodes) employed in the electronic circuitry on the printed wiring board. The optical fibers are supported by way of channels that are spaced apart from one another and integrally molded into the support substrate.

In addition to such optical indicators, the composite card architecture of the invention may include other types of input/output ports, such as switches, test probe terminals, and the like. These auxiliary components may be mounted to an auxiliary printed wiring board that is removably mounted to the front end of the support substrate. Communication between the circuit traces on the auxiliary printed wiring board and the printed wiring daughterboard may be effected by ribbon cable, flex circuit, and the like. The cable may be retained in place, by a cable clip, hold-downs or the like.

To provide external access to these auxiliary input/output ports, the front panel may include additional apertures aligned with the auxiliary components mounted on the auxiliary printed wiring board, once it has been mounted to the support substrate. The front panel may also include an ejector latch of standard configuration, which is pivotably mounted to a standoff integrally molded into the support substrate portion adjacent to a longitudinal slot in the front panel, that is sized to accommodate the ejector latch, for use as in a conventional form factor-compatible card.

DETAILED DESCRIPTION

Figure 1:
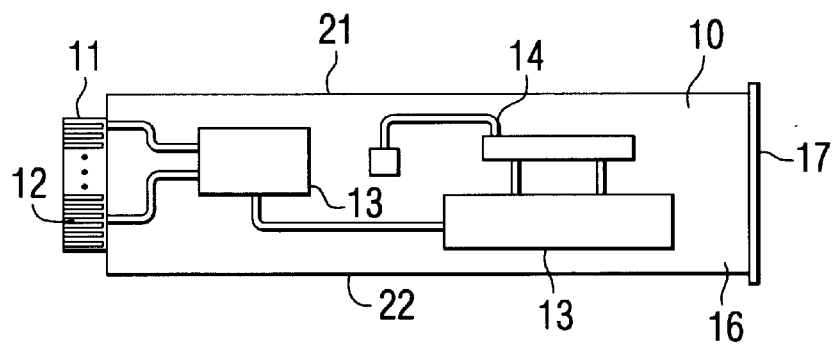
FIG. 1 is a diagrammatic side view of a printed wiring circuit card that is installable into an electrical backplane connector of a telecommunications channel bank equipment rack.
Figure 2:
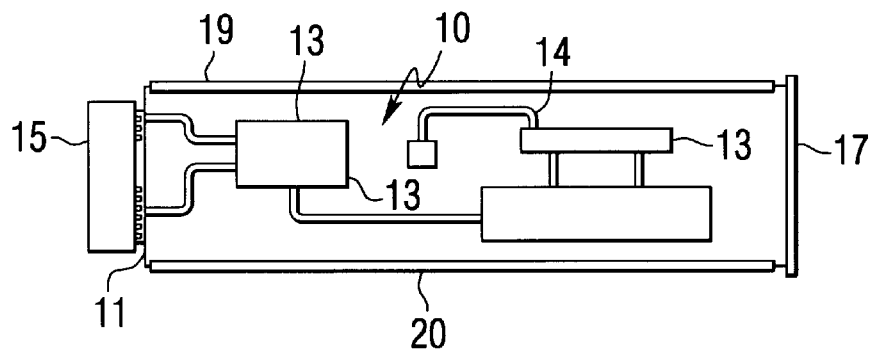
FIG. 2 shows the printed wiring circuit card of FIG. 1 inserted into guide tracks of a card slot and captured by an electrical backplane connector.
Figure 3:
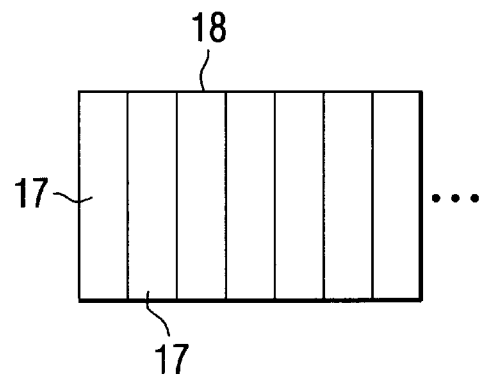
FIG. 3 is a diagrammatic front view of a card slot opening for receiving a plurality of parallel arranged circuit cards.
Figure 4:
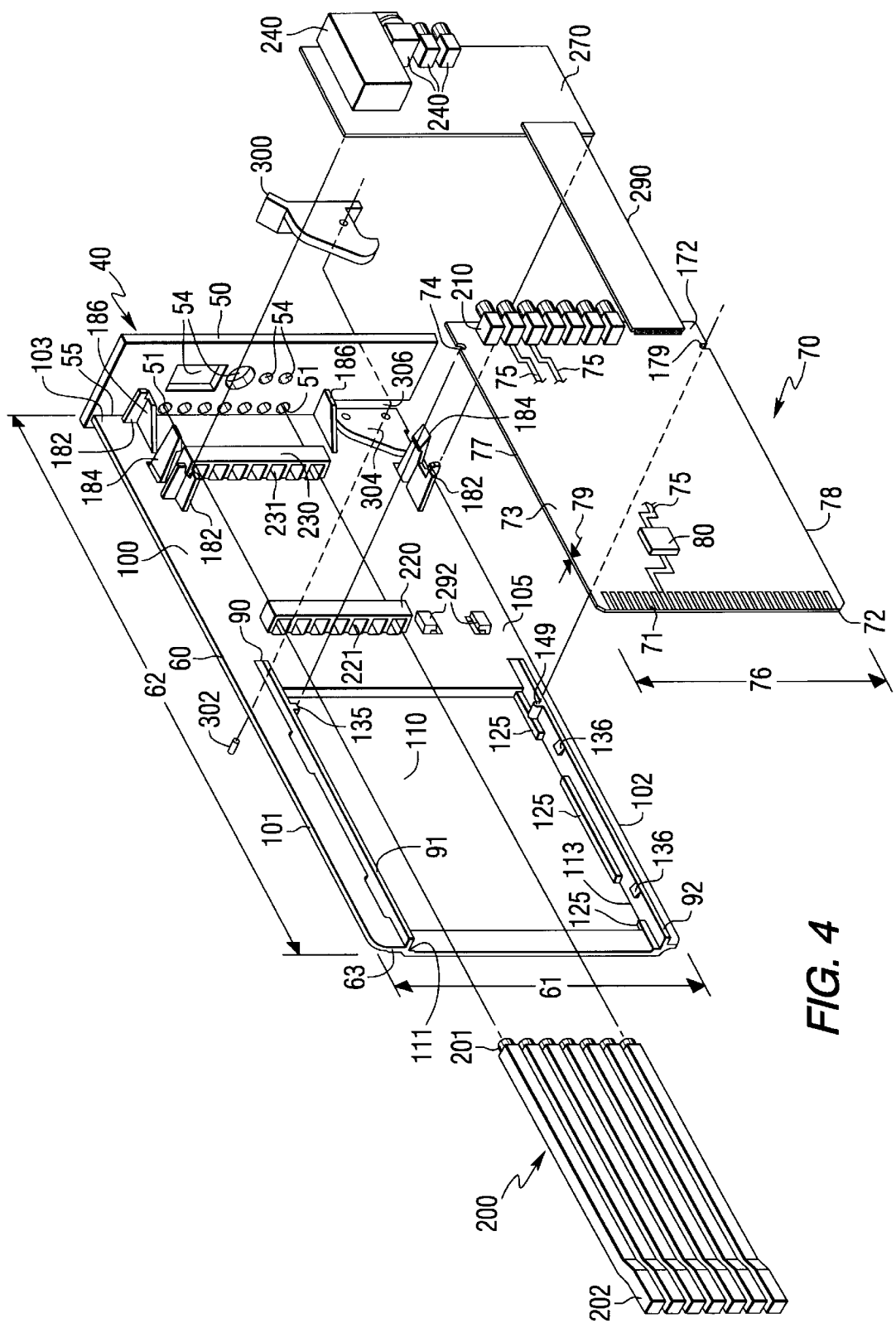
FIG. 4 is a diagrammatic perspective exploded view of an embodiment of the composite circuit card architecture of the present invention.
Figure 5:
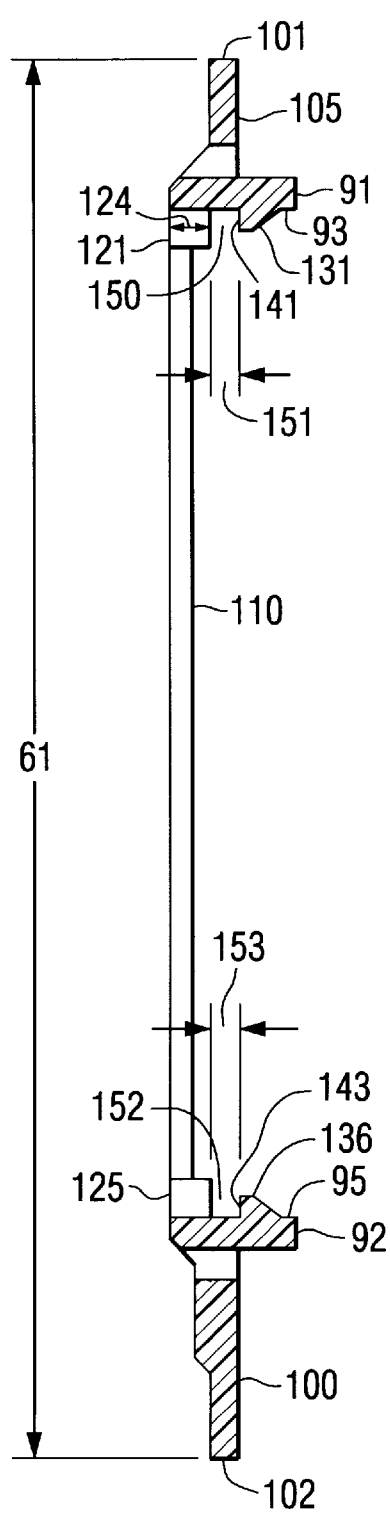
FIG. 5 is a diagrammatic sectional end view of the pseudo card support substrate of FIG. 4 taken through a respective optical fiber channel.
Figure 6:
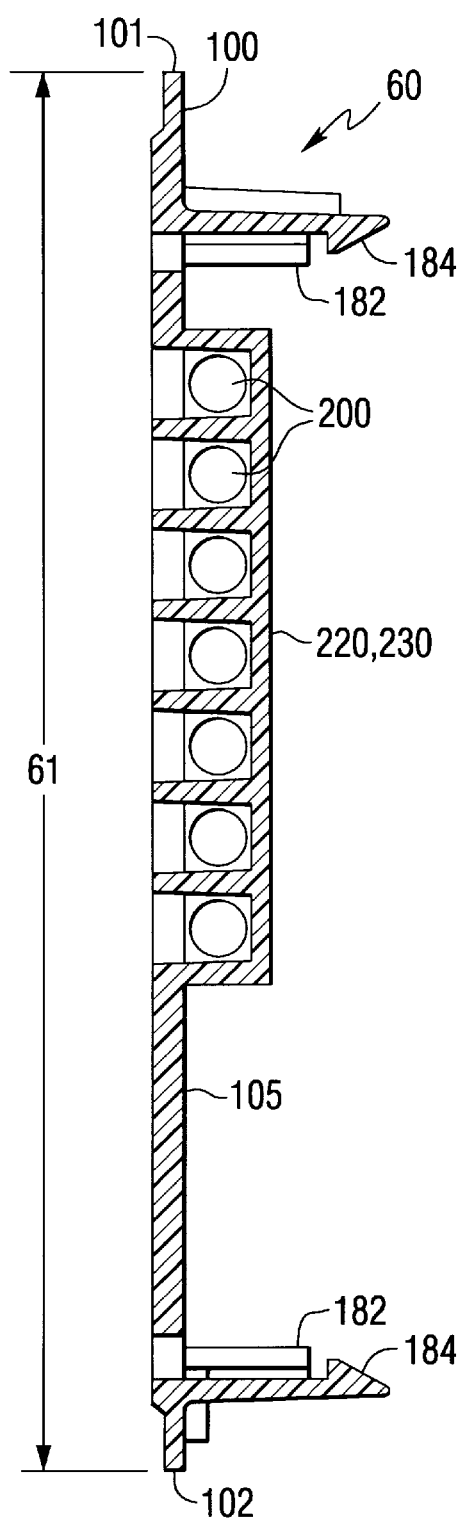
FIG. 6 is a diagrammatic sectional end view of the pseudo card support substrate of FIG. 4 taken through the carrier frame.

The composite card architecture in accordance with a preferred embodiment of the present invention is diagrammatically illustrated in FIGS. 4–6, as comprising a generally form factor compatible, pseudo circuit card 40, that includes a card-shaped support substrate portion 60 as a supporting motherboard, and a front panel portion 50. The entirety of the substrate and front panel portions of card 40 are preferably configured as a unitary molded piece of plastic material (such as injected molded plastic, as a non-limiting example). The support substrate 60 has a generally rectangularly configured, form factor-compatible shape, and is dimensioned to generally correspond to the size and shape of an industry standard printed circuit card, described above with reference to FIGS. 1–3.

Support substrate 60 has a height 61 that corresponds to the spacing between upper and lower guide tracks of a standard card slot, so that the pseudo circuit card 40 is slidably installable within the upper and lower card slots tracks, when the card is inserted through the front of an equipment rack, whereby the front panel 50 is coincident with the front panel of the rack, thereby closing its card slot portion of the card insertion opening. However, the length 62 of support substrate 60 is dimensioned slightly less than that of a standard card. As a result, when inserted into a card slot, a rear edge portion 63 of the support substrate 60, which contains no backplane engaging conductor leads, will not reach the backplane connector. Instead, lead connector traces 71 along a rear edge portion 72 of a printed wiring daughter board 70, that is (removably) mounted to the support substrate 60 by way of a carrier frame 90, to be described, extend beyond the rear edge portion 63 of the support substrate 60 to engage the backplane connector.

Printed wiring daughter board 70 may be made of a standard circuit board material, such as industry standard printed circuit fiberglass sheet 73, on which conductive material (copper, gold) has been selectively formed (non-selectively deposited and selectively etched) into a pattern of interconnect traces 75, and to which electronic circuit-components 80 that implement a prescribed signal processing function) are electrically and physically bonded in a conventional manner. As pointed out previously, the essential difference between printed wiring daughterboard 70 and a conventional slot-installable circuit card is size and waste of production.

More particularly, as can be seen from the perspective view of FIG. 4, for example, the printed wiring daughterboard 70 is smaller than the injection molded plastic (motherboard) support substrate 60, to which it is mounted by way of carrier frame 90. In particularly the height 76 of the printed wiring board 70, between its upper edge 77 and lower edge 78, is less than the height 61 of the plastic support substrate 60 (which conforms with that of the backplane-engaging rear portion of the standard, form factor-compatible circuit card, as described above). Also, in addition to printed wiring board 70 having less depth and height than the support substrate 60, the rear edge region 72 of the printed wiring board 70 contains the plurality of backplane connector-engaging, lead connector traces 71. As noted above, these lead connector traces 71 are connected to the interconnect traces 75 of the patterned conductive material that has been selectively etched onto the printed wiring board 70.

The carrier frame 90 of molded plastic support substrate 60 is configured to support printed wiring board 70 in a position such that, when the support substrate 60 is inserted into a card slot, the rear edge region 72 of the printed wiring board 70 will be aligned with and insertible into a respective card slot's backplane connector, so that backplane connections to the circuit components 80 of the circuit installed on the printed wiring board 70 may be effected. For this purpose, generally rectangular card-configured support substrate 60 has a first, generally planar-shaped support substrate portion 100, top and bottom edges 101 and 102, respectively, of which are alignable with and insertible into the upper and lower guide tracks of a respective card slot. A first, front end 103 of substrate portion 100 is integrally joined with and terminates at the front panel 50 along a joinder edge 55.

Support substrate 60 further includes a second, generally flat support substrate portion 110, that is slightly offset or recessed relative to a surface 105 of the first substrate portion 100. This second substrate portion 110 has upper and lower edges 111 and 113, that are set in from respective top and bottom edges 101 and 102, so as to provide sufficient clearance for the support substrate 60 to be slidably insertible into guide tracks of a respective card slot, while still accommodating upper and lower printed wiring board engagement rails 91 and 92 of carrier frame 90.

As shown in FIG. 4 and in detail in the cross sectional view of FIG. 5, upper engagement rail 91 of carrier frame 90 has a set of generally bar-configured stops 121, each of a width or thickness 124 slightly less than the depth or offset of the second, generally flat substrate portion 110 relative to the surface 105 of the first substrate portion 100. The width 124 of stops 121 is such that placement of the printed wiring board 70 against these stops will locate the printed wiring board 70 in the plane of the first, generally planar-shaped substrate portion 100, thereby aligning the rear edge 71 of the printed wiring board 70 with the top and bottom edges 101 and 102 of the first portion 100 of the substrate 60, and thereby with a backplane connector adjacent to the interior terminal ends of the upper and lower guide tracks of a respective card slot.

Disposed along the outer edge 93 of upper engagement rail 91 are plural tapered or wedge-shaped tab elements 131. Interior edges 141 of tab elements 131 are spaced apart from stops 121, so as to form a channel 150 therebetween along the interior surface of the upper engagement rail 91. The width 151 of the channel 150 corresponds generally to the thickness 79 of printed wiring board 70, so that when its upper edge 77 is inserted in the channel 150, the upper edge will be retained between tab elements 131 and stops 121. Upper engagement rail 91 further includes a ridge 135, which is sized to engage a corresponding slot 74 in the upper edge 77 of printed wiring board 70, so that relative movement between the printed wiring board 70 and the support substrate 60 in the direction of the card slot 150 is constrained.

Similarly, lower engagement rail 92 of carrier frame 90 has a set of bar-configured stops 125, each having the same width 124 of the stops on the upper engagement rail 91. The outer edge 95 of lower engagement rail 92 has a plurality of tapered tab elements 136, interior edges 143 of which are spaced apart from stops 125, so as to form a channel 152 therebetween along the interior surface of the lower engagement rail 92. The width 153 of channel 152 also corresponds generally to the thickness 79 of the printed wiring board 70, so that when its lower edge 78 is inserted into the channel 152, the lower edge 78 will be retained between tab elements 136 and stops 125. The lower engagement rail 92 also includes a ridge 149, which is sized to engage a corresponding slot 179 in the lower edge 78 of printed wiring board 70, to constrain relative movement between the printed wiring board 70 and the support substrate 60.

The printed circuit board 70 is removably mounted to the carrier frame 90 by inserting one of the upper or lower edges, such as lower edge 78, into its respective lower engagement rail channel 152, with ridge 149 aligned with slot 179 in the lower edge 78 of the printed wiring board 70. The printed wiring board 70 is then rotated about this insertion point, so that its upper edge 77 rides over the tapered tab elements 131 and snaps into upper engagement rail channel 150. This locks the printed wiring board 70 in place, aligning its rear edge 71 with the top and bottom edges 101 and 102 of the first portion 100 of the substrate 60, and thereby with a backplane connector adjacent to the interior terminal ends of the upper and lower guide tracks of a respective card slot, as described above.

As pointed out above, the composite card architecture of the present invention further may further include at least one input/output port that is accessible at the integrally molded front panel 50, and at least one associated communication link coupled between the reduced size printed circuit board 70 and the at least one input/output port at the front end of the of the pseudo circuit card adjacent to the card's front panel. For this purpose, as a non-limiting example, the front panel 50 has a plurality of circular apertures 51, disposed in a linear array adjacent to the front panel's intersection or joinder edge 55 with the front end 103 of the first substrate portion 100. Apertures 51 are sized to receive respective first ends 201 of communication links 200, which may be configured as optical fibers or light pipes 200, as a non-limiting example. In the illustrated embodiment, second ends 202 of links 200 are coupled to respective ones of a set of electro-optic transducers (such as light emitting diodes) 210 employed in the electronic circuitry on the printed wiring board 70, and mounted adjacent to its front edge 172.

The optical fibers 200 are supported by way of two sets of closed U-shaped channels 220 and 230, that are spaced apart from one another on the first substrate portion 100, such that individual channel slots 221 and 231 thereof are aligned with the apertures 51 of the front panel 50 and the electro-optic transducers 210 on the printed wiring board 70, once the printed wiring board 70 has been installed in carrier frame 90. With light pipes 200 being coupled between the apertures 51 in the front panel 50 and the set of electro-optic transducers of the electronic circuitry on the printed wiring board 70, the front panel provides a set of optical indicators through which operation of the circuitry of the card may be visually monitored.

In addition to such optical indicators, the composite card architecture of the invention may include other types of input/output ports, such as switches, test probe terminals, auxiliary indicators and the like, as diagrammatically illustrated at 240. These auxiliary components are mounted to an auxiliary printed wiring board 270 that is removably mounted to the front end of the first support substrate 100. Mounting of the auxiliary printed wiring board 270 is effected by means of a set of mounting fixtures, which include standoffs 182 and flexible locking tabs 184, that are integrally molded into the substrate 60 and are configured so that the auxiliary printed wiring board 270 may be snapped into place and retained or locked against the outer support surfaces of standoffs 182, as shown. Communication between the circuit traces on the auxiliary printed wiring board 270 and the printed wiring board 70 is effected by means of a ribbon cable, flex circuit, and the like, shown at 290. To retain the ribbon cable in place, a cable clip sized to accommodate different sized cables may be used, or optionally a pair of generally L-shaped cable hold-downs may be molded into the first substrate portion beneath the channels 220 and 230, as shown at 292.

In order to provide external access to the additional input/output ports, front panel 50 has additional apertures 54 that are aligned with the auxiliary components mounted on the auxiliary printed wiring board 270, when it has been snapped into place and retained on the mounting fixtures 180. Also, one or more gussets 186 may be installed between the first support substrate 100 and the front panel to provide structural rigidity between the front panel 50 and the support substrate 60. The front panel 50 may also include an ejector latch 300 of standard configuration, which is pivotably mounted via a spring pin 302 to a standoff 304. Standoff 304 is integrally molded into the front end 103 of the first substrate portion 100, adjacent to a longitudinal slot 306 in the front panel 50, that is sized to accommodate the ejector latch 300, for use as in a conventional form factor-compatible card.

As will be appreciated from the foregoing description, the 'composite' circuit card architecture of the present invention takes advantage of two attributes of materials production and microelectronics manufacturing to substantially reduce the cost of a standard form factor compatible circuit card, such as that used in the telecommunications industry. On the one hand, the invention employs the substantial increased integration density offered by the microelectronics manufacturing industry to reduce printed wiring board circuit occupancy area to only a fraction of that available on a card having a standard form factor. On the other hand, the remainder of the card architecture, including the front panel, where no printed circuit components are installed, may be formed of a material, such as molded plastic, which is less costly than that of the printed wiring board, thereby significantly reducing the cost associated with the conventional approach of making the entire card from printed circuit board material.

In the non-limiting example described above, the card's principal circuit functionality is implemented by way of a single, reduced size printed wiring board 70, that is mounted to the rear of the support substrate 60 and is engageable with the card slot's backplane connector. For auxiliary input/output functionality, an additional printed wiring board 270 is installed adjacent to the front panel 50. It should be observed, however, that the size and locations of such reduced size printed wiring board(s) are not limited to those shown and described here, but may vary, depending upon the application.

While we have shown and described an embodiment in accordance with the present invention, it is to be understood that the same is not limited there to but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. A hardware architecture adapted to install an electronic circuit in a housing having a plurality of card slots, which are sized to support circuit cards having form factor comprising:

a printed circuit board having a configuration that does not conform with said form factor, and containing said electronic circuit, said printed circuit board including a plurality of conductors that are sized and arranged to engage associated conductors of a backplane connector installed in said housing and exclusive of a pseudo circuit card supporting said printed circuit board, when a pseudo card supporting said printed circuit board is inserted into one of said plurality of card slots; and a pseudo circuit card supporting said printed circuit board and made of a material other than that of said printed circuit board, and conforming with said form factor, so as to be insertible into said one of said plurality of card slots, and thereby bring said plurality of conductors of said printed circuit card into engagement with said associated conductors of said backplane connector.

2. A hardware architecture according to claim 1, further including a front panel affixed to said pseudo circuit card.

3. A hardware architecture according to claim 2, wherein said front panel is integrally molded with said pseudo circuit card.

4. A hardware architecture according to claim 2, further including at least one communication link coupled between said printed circuit board and at least one input/output device at said front panel.

5. A hardware architecture according to claim 4, wherein said at least one input/output device includes at least one optical indicator.

6. A hardware architecture according to claim 2, further including an additional printed circuit board supported by said pseudo circuit card adjacent to said front panel.

7. A hardware architecture according to claim 6, further including a flex circuit coupled between said printed circuit board not conforming with said form factor and said additional printed circuit board.

8. A hardware architecture according to claim 1, wherein said card slots are card slots of a D4 channel bank.

9. A hardware architecture according to claim 1, wherein said pseudo circuit card contains attachment elements integrally molded therewith for removably mounting said printed circuit board containing said electronic circuit.

10. A hardware architecture according to claim 9, wherein said pseudo circuit card comprises a generally rectangular card-configured substrate having a first substrate portion that is alignable with and insertible into said one of said plurality of card slots, and a second substrate portion that is offset from said first substrate portion and is configured to accommodate said printed circuit board in coplanar alignment with said first substrate portion, so that as said pseudo card is physically inserted into and captured in said one of said plurality of card slots, said plurality of conductors of said end of said printed circuit board engage said associated conductors of said backplane connector installed in said housing in alignment with said one of said plurality of card slots.

11. A hardware architecture according to claim 10, wherein said second substrate portion contains attachment elements integrally molded therewith for removably mounting said printed circuit board in said coplanar alignment with said first substrate portion.

12. A composite form factor compatible circuit card structure that conforms with a form factor and being adapted to be installed in a card slot of a multiple circuit card-supporting housing, comprising a printed wiring board that does not conform with said form factor, and upon which printed circuit components are installed, and a generally form factor-conformal support substrate, made of a material other than that of said printed wiring board, and being configured to conform with said form factor, and having a length less than that of a standard card, so that when said support substrate is inserted into said card slot, a rear portion of the support substrate will not reach a backplane connector of said card slot, and wherein said printed wiring board is supported by said support substrate such that conductors at a rear portion of said printed wiring board extend beyond said rear portion of said support substrate and are adapted to engage said backplane connector, when said support substrate is inserted into said card slot.

13. A composite form factor compatible circuit card structure according to claim 12, further including a front panel portion, made of said material other than that of said printed wiring board, affixed to said support substrate.

14. A composite form factor compatible circuit card structure according to claim 12, wherein said support substrate comprises a generally rectangular shaped carrier frame.

15. A composite form factor compatible circuit card structure according to claim 12, wherein said generally rectangular shaped carrier frame contains attachment elements integrally molded therewith for removably mounting said printed wiring board.

* * * * *